United States Patent
Staudacher et al.

(10) Patent No.: US 12,104,274 B2
(45) Date of Patent: Oct. 1, 2024

(54) METHOD AND DEVICE FOR PRODUCING A SINGLE CRYSTAL OF SILICON, WHICH SINGLE CRYSTAL IS DOPED WITH N-TYPE DOPANT

(71) Applicant: SILTRONIC AG, Munich (DE)

(72) Inventors: Wolfgang Staudacher, Munich (DE); Georg Raming, Tann (DE)

(73) Assignee: SILTRONIC AG, Munich (DE)

( * ) Notice: Subject to any disclaimer, the term of this patent is extended or adjusted under 35 U.S.C. 154(b) by 131 days.

(21) Appl. No.: 17/784,742

(22) PCT Filed: Dec. 3, 2020

(86) PCT No.: PCT/EP2020/084390
§ 371 (c)(1),
(2) Date: Jun. 13, 2022

(87) PCT Pub. No.: WO2021/115904
PCT Pub. Date: Jun. 17, 2021

(65) Prior Publication Data
US 2023/0332323 A1    Oct. 19, 2023

(30) Foreign Application Priority Data
Dec. 13, 2019 (EP) .................................. 19216068

(51) Int. Cl.
*C30B 15/04* (2006.01)
*C30B 15/10* (2006.01)
*C30B 15/26* (2006.01)
*C30B 29/06* (2006.01)

(52) U.S. Cl.
CPC .............. *C30B 15/04* (2013.01); *C30B 15/10* (2013.01); *C30B 15/26* (2013.01); *C30B 29/06* (2013.01)

(58) Field of Classification Search
CPC .......... C30B 15/04; C30B 15/10; C30B 29/06
See application file for complete search history.

(56) References Cited

U.S. PATENT DOCUMENTS

| | | | | |
|---|---|---|---|---|
| 2010/0294999 | A1* | 11/2010 | Narushima | ............. C30B 15/04 117/214 |
| 2020/0048789 | A1* | 2/2020 | Soeta | ....................... C30B 29/06 |
| 2022/0364258 | A1* | 11/2022 | Narimatsu | .............. C30B 29/06 |

FOREIGN PATENT DOCUMENTS

| | | | | |
|---|---|---|---|---|
| CN | 1600905 A | | 3/2005 | |
| CN | 206736402 U | * | 12/2017 | ............. C30B 15/00 |
| DE | 112017004790 T5 | | 6/2019 | |

(Continued)

OTHER PUBLICATIONS

European Patent Office, English computer translation of JP 06-183874 (Year: 2023).*

(Continued)

*Primary Examiner* — Matthew J Song
(74) *Attorney, Agent, or Firm* — BROOKS KUSHMAN P.C.

(57) ABSTRACT

Single crystal silicon cylindrical portions grown by the CZ method and highly doped with one or more n-type dopants so as to have a resistivity of not more than 2 mΩcm are prepared by directing dopant in a gas flow from an external sublimation apparatus into the pulling chamber through or below the heat shield, to the bottom of an annular ring of the heat shield and from there through a plurality of nozzles toward the surface of the melt.

15 Claims, 3 Drawing Sheets

(56) References Cited

FOREIGN PATENT DOCUMENTS

| JP | 06122587 | A | * | 5/1994 | ............. | C30B 15/00 |
| JP | 06183874 | A | * | 7/1994 | ............. | C30B 15/00 |
| JP | 2009242142 | A | * | 10/2009 | ............. | C30B 15/04 |
| JP | 2013129551 | A | | 7/2013 | | |
| WO | 2009119342 | A1 | | 10/2009 | | |

OTHER PUBLICATIONS

European Patent Office, English computer translation of CN 206736402 (Year: 2023).*
European Patent Office, English computer translation of JP 2009-242142 (Year: 2023).*
European Patent Office, English computer translation of JP 06-122587 (Year: 2023).*

* cited by examiner

METHOD AND DEVICE FOR PRODUCING A SINGLE CRYSTAL OF SILICON, WHICH SINGLE CRYSTAL IS DOPED WITH N-TYPE DOPANT

CROSS REFERENCE TO RELATED APPLICATIONS

This application is the U.S. National Phase of PCT Appln. No. PCT/EP2020/084390 filed Dec. 3, 2020, which claims priority to European Application No. 19216068.7 filed Dec. 13, 2019, the disclosures of which are incorporated in their entirety by reference herein.

BACKGROUND OF THE INVENTION

1. Field of the Invention

A subject of the invention is a method for producing a single silicon crystal doped with n-type dopant and having in a cylindrical portion an electrical resistivity of not more than 2 mohmcm, by pulling of the single crystal by the CZ method from a melt contained in a crucible. A further subject of the invention is an apparatus for implementing the method.

2. Description of the Related Art

The production of a single silicon crystal containing n-type dopant at a comparatively high concentration is especially challenging. The dopant is volatile and can form deposits which may trigger dislocations. It has proven advantageous to supply dopant to the melt for the first time or additionally during a phase of the pulling of a cylindrical portion of the growing single crystal. US 2010/0294999 A1 describes a method of this kind which envisages the blowing of a gas stream comprising the elemental dopant through a tube to the surface of the melt. For this to occur, the solid dopant is sublimed in the pulling chamber and after admixture with a carrier gas is blown to the surface of the melt. A comparable procedure is adopted in a method which is explained in JP 2013-129 551 A.

CN 1 600 905 A and DE 11 2017 004 790 T5 advise providing multiple openings through which gaseous dopant is blown to the surface of the melt.

Disadvantages of these proposals are that they require modifications to the zone immediately surrounding the growing single crystal (hot zone), to make space there for the dopant to sublime, and that distribution of the dopant lacks uniformity in spite of the provision of multiple openings for blown introduction of the dopant.

It is an object of the invention to minimize modifications to the hot zone and to ensure a more uniform distribution of the dopant in the melt. The aim more particularly is to avoid local spikes in the dopant concentration which if present raise the risk of triggering dislocations in the growing single crystal.

SUMMARY OF THE INVENTION

The invention addresses the foregoing problems by providing a method for producing a single silicon crystal doped with n-type dopant and having, in a cylindrical portion an electrical resistivity of not more than 2 mohmcm, by pulling the single crystal by the CZ method from a melt contained in a crucible, comprising in the course of the pulling of the cylindrical portion of the single crystal, supplying a gas stream comprising gaseous dopant to a surface of the melt, wherein the gas stream is guided in a tubing system into a pulling chamber and through a heat shield which surrounds the growing single crystal, or along an outer surface of the heat shield, to an annular channel on a lower end of the heat shield and from there through nozzles to the surface of the melt.

DETAILED DESCRIPTION OF THE PREFERRED EMBODIMENTS

Figure 1:
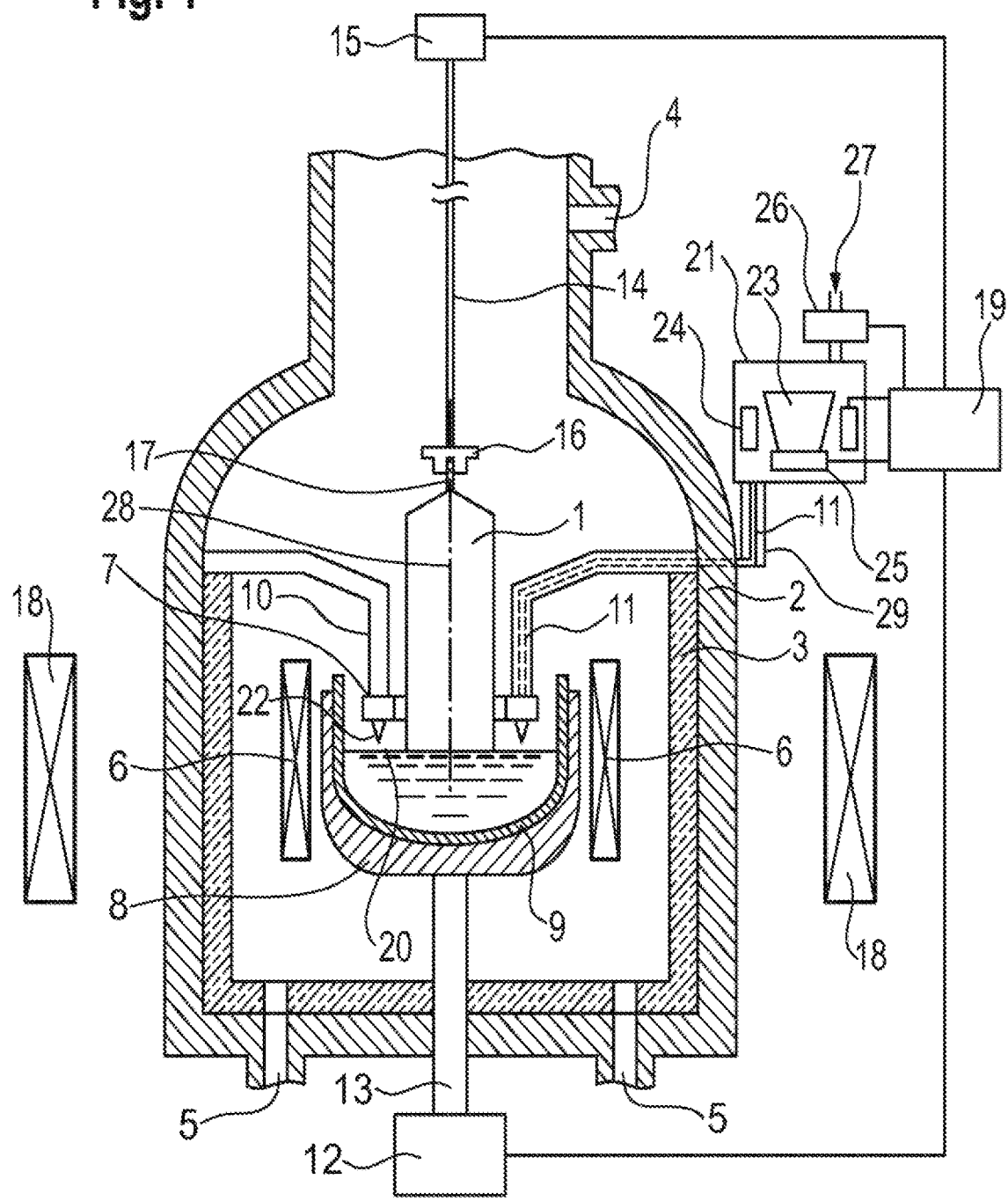
FIG. 1 shows an apparatus according to a first embodiment of the invention.

The cylindrical portion of the single crystal has partly or preferably completely the electrical resistivity of not more than 2 mohmcm. Where the dopant is phosphorus, the electrical resistivity in the cylindrical portion of the single crystal is preferably not more than 1.2 mohmcm, more preferably not more than 1 mohmcm.

Particular modifications to the hot zone are avoided in particular by disposing the site at which solid dopant is sublimed into the gaseous state outside the pulling chamber. Furthermore, the path of the gaseous dopant leads in a tubing system through a heat shield or along an outer surface of the heat shield up to an annular channel of the lower end of the heat shield and from there through nozzles to the surface of the melt.

The outer surface of the heat shield denotes the side area of the heat shield which is first struck by the thermal radiation of a heating facility arranged around the crucible (crucible heater).

The dopant is sublimed outside the pulling chamber and is flushed together with a carrier gas through the tubing system into the annular channel, from where it is guided through the nozzles to the surface of the melt.

At least two and preferably 4 to 100 nozzles are provided. The tips of the nozzles, where the gas stream composed of carrier gas and dopant gas emerges, have a distance of preferably not more than 20 mm from the surface of the melt.

With the aid of the arrangement of the nozzles, the gas stream is guided in a predetermined way onto the surface of the melt.

The nozzles may be arranged in such a way that the gas stream is guided in a direction perpendicular to the surface of the melt or toward the surface of the melt with a directional component toward an axis through the middle of the growing single crystal, or toward the surface of the melt with a directional component away from the axis through the middle of the growing single crystal.

The nozzles are preferably arranged in such a way that the gas stream of adjacent nozzles is guided in respective different directions—for example, alternately in two or three of the three above-designated directions, i.e. for example, alternately in a direction perpendicular to the surface of the melt and in a direction toward the axis through the middle of the growing single crystal, or alternately in a direction toward the axis through the middle of the growing single crystal and in a direction away from the axis through the middle of the growing single crystal.

It is particularly preferable to configure the nozzles swivelably and to orient their exit openings before the installation of the heat shield in such a way that during the pulling of the cylindrical portion the nozzles occupy a desired arrangement.

The guiding of the gas stream to the surface of the melt during the pulling of the cylindrical portion of the single crystal may take place permanently or intermittently. Should the melt contain comparatively little or no dopant at the start of the pulling of the cylindrical portion of the single crystal, the gas stream is guided to the surface of the melt at this moment. The volume rate of the gas flow may be kept constant or changing. For example, the volume rate of the gas flow may be reduced with increasing crystallization of the single crystal, in order to compensate the accumulation of dopant in the melt through segregation.

The dopant preferably consists of one or more of the elements phosphorus, arsenic, and antimony, which are admixed in a facility for subliming dopant (sublimation facility) into the gaseous state. It is also possible, however, to use dopant of one or more chemical compounds of these elements that are already in gas form, examples being compounds of these elements with hydrogen. In that case the sublimation facility is used only in order to mix dopant gas and carrier gas.

Also a subject of the invention is an apparatus for producing a single silicon crystal doped with an n-type dopant and having in a cylindrical portion an electrical resistivity of not more than 2 mohmcm, comprising a pulling chamber for pulling the single crystal by the CZ method;
a crucible for accommodating a melt of silicon;
a heat shield for shielding a growing single crystal;
a sublimation facility for converting solid dopant into gaseous dopant, and a tubing system for supplying a gas stream comprising the gaseous dopant to a surface of the melt,
wherein the sublimation facility is arranged outside the pulling chamber, and the tubing system, leading through the heat shield or along an outer surface of the heat shield, opens out in an annular channel at the lower end of the heat shield, and the annular channel has nozzles for guiding the gas stream to the surface of the melt.

The annular channel and nozzles preferably consist of a particularly corrosion-resistant material such as, for example, molybdenum, as does also at least that part of the tubing system whose distance from the surface of the melt is not more than 200 mm.

Arranged outside the pulling chamber is a sublimation facility which comprises a container for dopant and a container heater surrounding it. The container heater may possess a plurality of separately controllable heating zones, then improving control of the amount of dopant subliming. Also present is a weighing cell, which detects the change in the weight of the container contents during the pulling of the single crystal. From this information it is possible to ascertain dopant consumption and control the further supply of dopant to the melt in a targeted way. Instead of or in addition to the weighing cell, it is possible to provide either a camera with image processing, used to determine dopant consumption, or else, for the same purpose, a flow meter in that part of the tubing system which lies outside the pulling chamber.

On the entry side, the sublimation facility is connected to a flow regulator which is used to mix carrier gas and dopant gas in the sublimation facility and guide the mixture into the pulling chamber. On the exit side, a part of the tubing system joins the sublimation facility to a flange on the outer wall of the pulling chamber. From there, the tubing system leads further up to an annular channel on the lower end of a heat shield which surrounds the growing single crystal. The heat shield is mounted in fixed position relative to the surface of the melt.

Measures ought to be taken to prevent sublimed dopant precipitating as a solid within the tubing system. It is therefore preferred for that part of the tubing system which is arranged between the sublimation facility and the pulling chamber, including the region of the flange of the outer wall of the pulling chamber, to be thermally insulated or provided regionally or completely with a tubing heater and heated from the outside by means of this heater.

The flow regulator, the weighing cell, and the container heater are preferably connected to a regulating apparatus for the apparatus for pulling the single crystal. The regulating apparatus processes data from these components and regulates the heating power of the container heater and the delivery of carrier gas through the flow regulator, in order to ensure a supply of dopant to the melt that is predetermined or is computed within a control circuit.

According to a first embodiment of the invention, the tubing system leads further through the heat shield up to the annular channel. According to a second embodiment of the invention, the tubing system leads further along the outer surface of the heat shield up to the annular channel.

Distributed uniformly over the lower side of the annular channel are nozzles which point to the surface of the melt. The number of nozzles is preferably 4 to 100 nozzles. The nozzles are arranged in a predetermined way. In one possible arrangement, all of the nozzles are aligned perpendicularly to the surface of the melt, so that the gas stream strikes the surface of the melt virtually at right angles. In another arrangement, the nozzles have a tilted alignment radially toward the single crystal, in other words with a directional component or an axis through the middle of the growing single crystal. In a further arrangement, the nozzles have an alignment tilted radially away from the single crystal, in other words with a directional component away from the axis through the middle of the growing single crystal.

A particularly preferred arrangement is that in which the orientation of adjacent nozzles is different—for example, an arrangement in which the orientation of the nozzles alternates between the arrangement perpendicular to the surface, the tilted arrangement toward the single crystal, and the tilted arrangement away from the single crystal.

The invention is further elucidated below with reference to drawings.

LIST OF REFERENCE NUMERALS USED 1 growing single crystal
2 pulling chamber
3 heat insulation
4 gas inlet
5 gas outlet
6 crucible heater
7 annular channel
8 outer crucible
9 inner crucible
10 heat shield
11 tubing system
12 crucible shaft drive
13 crucible shaft 14 pulling shaft
15 pulling shaft drive
16 seed crystal holder
17 seed crystal
18 facility for generating a magnetic field
19 regulating apparatus
20 surface of the melt
21 facility for subliming dopant
22 nozzle
23 container for dopant
24 container heater
25 weighing cell
26 flow regulator
27 carrier gas
28 axis through the middle of the growing single crystal
29 tubing heater The apparatus according to FIG. 1 comprises a pulling chamber 2, which houses an inner crucible 9, which by means of a crucible shaft 13 can be rotated, raised, and lowered. The inner crucible 9 is supported by an outer crucible 8. The crucible shaft 13 is moved by a crucible shaft drive 12, which is connected to a regulating apparatus 19 of the apparatus for pulling the single crystal. Heat insulation 3 shields the inner wall of the pulling chamber from thermal radiation delivered by a crucible heater 6 arranged around the crucibles 8 and 9. The pulling chamber 2 further comprises a gas inlet 4 and a gas outlet 5 for conducting a process gas such as argon or a process gas mixture such as argon and hydrogen during the pulling of a single crystal. A heat shield 10, which is mounted in fixed position, surrounds a growing single crystal 1 during the operation of the apparatus. The single crystal 1 grows on a seed crystal 17, which is clamped in a seed crystal holder 16, and is pulled upward by means of a pulling mechanism—for example, a pulling shaft 14 and a pulling shaft drive 15—from the surface 20 of a melt of silicon, and is rotated about the axis 28 through its middle while it is being pulled. The pulling chamber 2 is surrounded by a facility 18 for generating a magnetic field, such as a horizontal magnetic field or a CUSP magnetic field, for example.

Provision is made in accordance with the invention to arrange, outside the pulling chamber 2, a facility 21 for supplying dopant (sublimation facility) and to connect it to a tubing system 11 which guides dopant which has been converted into the gaseous state in the sublimation facility 21, in the form of a gas stream comprising the gaseous dopant and a carrier gas 27, into an annular channel 7 and from there, through nozzles 22, to the surface 20 of the melt. The annular channel is arranged on the lower end of the heat shield 10. The sublimation facility 21 comprises a container 23 for dopant, a container heater 24, and a weighing cell 25. The container heater 24, the weighing cell, and a flow regulator 26, which supplies the carrier gas to the gaseous dopant, are connected to the regulating apparatus 19. Around the tubing system 11, in the region outside the pulling chamber 2, there is preferably a tubing heater 29 arranged, regionally or completely, for heating the tubing system 11.

According to the embodiment shown in FIG. 1, the tubing system 11 leads through the heat shield 19 and opens out into the annular channel 7.

Figure 2:
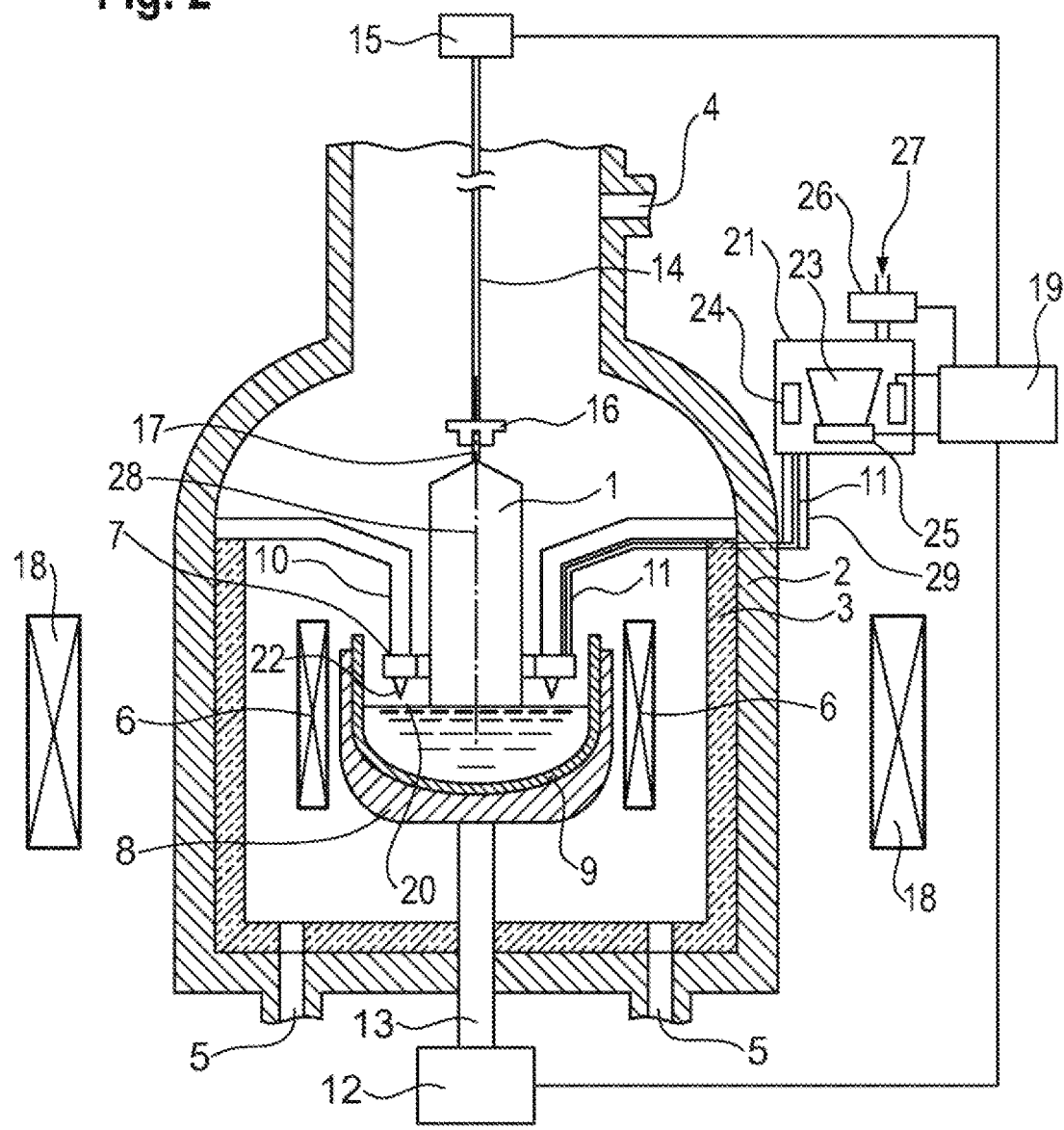
FIG. 2 shows an apparatus according to a second embodiment of the invention.

According to the embodiment shown in FIG. 2, the tubing system 11 leads along the outer surface of the heat shield 19 into the annular channel 7.

Figure 3:
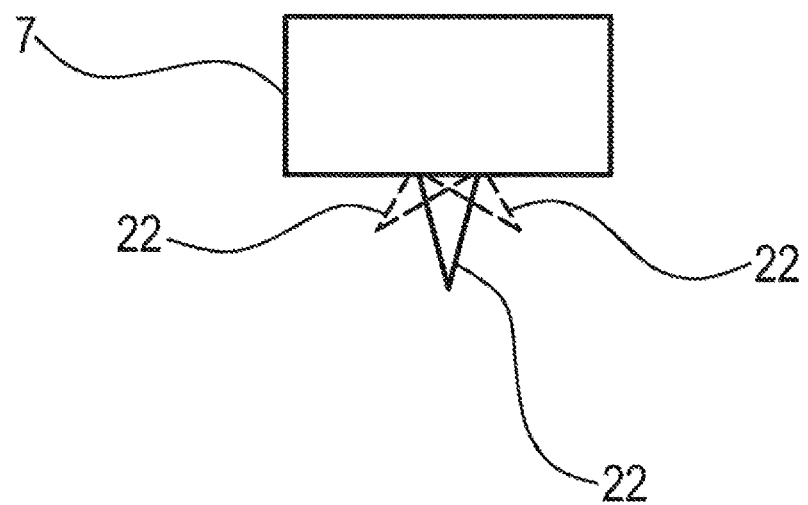
FIG. 3 shows possible arrangements of the nozzles directed from the annular channel to the surface of the melt.

The nozzles 22 are in a distributed arrangement over the side of the annular channel 7 that is opposite the surface of the melt, being distributed preferably with a uniform distance, and are directed to the surface 20 of the melt, either only with a directional component parallel to the axis 28 through the middle of the growing single crystal, or with an additional directional component toward this axis, or with an additional directional component away from this axis. FIG. 3 shows examples of such arrangements of the nozzle. Particularly preferred is an arrangement of the nozzles which implements alternately two or three of these three possibilities.

The above description of exemplary embodiments should be understood as an illustrative description. The disclosure it makes enables the skilled person on the one hand to understand the present invention and the advantages associated with it, and on the other hand, within the understanding of the skilled person, also embraces obvious alterations and modifications of the structures and methods described. It is therefore the intention that all such alterations and modifications, and also equivalents, should be covered by the scope of protection of the claims.

What is claimed is:

1. A method for producing a single silicon crystal doped with n-type dopant and having a cylindrical portion with an electrical resistivity of not more than 2 mΩ·cm comprising:
   pulling the single crystal by the CZ method from a melt contained in a crucible, and during the pulling of the cylindrical portion of the single crystal,
   supplying a gas stream comprising gaseous dopant to a surface of the melt, the gas stream being guided from a sublimation facility outside a pulling chamber through a tubing system into the pulling chamber, and through a heat shield surrounding the growing single crystal or along an outer surface of the heat shield, to an annular channel on a lower end of the heat shield and from there through a plurality of nozzles to the surface of the melt,
   ascertaining dopant consumption by a weighing cell, a camera with image processing, a flow meter, or combination thereof, located in a part of the tubing system which lies outside the pulling chamber, and
   controlling a supply of dopant to the melt.

2. The method of claim 1, wherein the dopant, in the form of a chemical compound of the dopant or in a molecular or atomic form of elemental dopant, is guided to the surface of the melt, and the dopant comprises one or more of the elements P, As, and/or Sb.

3. The method of claim 1, wherein the dopant is passed through from 4 to 100 nozzles to the surface of the melt.

4. The method of claim 1, wherein the gas stream is guided by the nozzles in a direction perpendicular to the surface of the melt, toward the surface of the melt in a direction away from an axis through the middle of the single crystal, or toward the surface of the melt in a direction toward the axis through the middle of the single crystal, or combinations of these directions.

5. The method of claim 1, wherein the gas stream is guided to the surface of the melt by adjacent nozzles in respectively different directions on account of their arrangement, with alternation of an arrangement perpendicular to the surface of the melt, a tilted arrangement toward the single crystal and a tilted arrangement away from the single crystal.

6. The method of claim 1, wherein the tubing of the tubing system which is outside of the pulling chamber is heated regionally or completely from outside of the tubing.

7. The method of claim 1, wherein dopant consumption is ascertained by a flow meter in the part of the tubing system which lies outside the pulling chamber.

8. The method of claim 1, wherein dopant consumption is ascertained by a weighing cell in the part of the tubing system which lies outside the pulling chamber.

9. An apparatus for producing a single silicon crystal doped with an n-type dopant and having a cylindrical portion with an electrical resistivity of not more than 2 mΩ·cm, comprising:
   a pulling chamber for pulling the single crystal by the CZ method;
   a crucible for accommodating a melt of silicon;
   a heat shield for shielding a growing single crystal;
   a sublimation facility for converting solid dopant into gaseous dopant, and a tubing system for supplying a gas stream comprising the gaseous dopant to a surface of the melt,
   wherein the sublimation facility is located outside the pulling chamber, and the tubing system, leading through the heat shield or along an outer surface of the heat shield, opens out into an annular channel at a lower end of the heat shield, and the annular channel has a plurality of nozzles for guiding the gaseous dopant to the surface of the melt, further comprising a weighing cell, a camera with image processing, a flow meter or combination thereof in a part of the tubing system which lies outside the pulling chamber.

10. The apparatus of claim 9, comprising from 4 to 100 nozzles.

11. The apparatus of claim 9, wherein the nozzles are distributed with uniform spacing over the annular channel.

12. The apparatus of claim 9, wherein adjacent nozzles are arranged such that the gas streams are guided in respectively different directions to the surface of the melt, with alternation of an arrangement perpendicular to the surface of the melt, a tilted arrangement toward the single crystal and a tilted arrangement away from the single crystal.

13. The apparatus of claim 9, further comprising a tubing heater which heats the tubing system outside the pulling chamber, regionally or completely, from the outside.

14. The apparatus of claim 9, wherein dopant consumption is ascertained by a flow meter in the part of the tubing system which lies outside the pulling chamber.

15. The apparatus of claim 9, wherein dopant consumption is ascertained by a weighing cell in the part of the tubing system which lies outside the pulling chamber.

* * * * *